US008493145B2

(12) United States Patent
Garudadri et al.

(10) Patent No.: US 8,493,145 B2
(45) **Date of Patent: *Jul. 23, 2013**

(54) SWITCHING POWER AMPLIFIER FOR QUANTIZED SIGNALS

(75) Inventors: Harinath Garudadri, San Diego, CA (US); Somdeb Majumdar, San Diego, CA (US); Daniel Keyes Butterfield, Encinitas, CA (US); Yi Tang, San Diego, CA (US); Sanjay Marthanda, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 3 days.

This patent is subject to a terminal disclaimer.

(21) Appl. No.: 13/112,232

(22) Filed: May 20, 2011

(65) Prior Publication Data

US 2011/0222703 A1 Sep. 15, 2011

Related U.S. Application Data

(63) Continuation of application No. 12/324,020, filed on Nov. 26, 2008, now Pat. No. 7,969,242.

(60) Provisional application No. 61/083,470, filed on Jul. 24, 2008.

(51) Int. Cl.
*H03F 21/00* (2006.01)

(52) U.S. Cl.
USPC ...................................... 330/207 A; 330/251

(58) Field of Classification Search
USPC ...................................... 330/10, 207 A, 251
See application file for complete search history.

(56) References Cited

U.S. PATENT DOCUMENTS

| | | | |
|---|---|---|---|
| 6,388,477 | B1 | 5/2002 | Juang |
| 6,472,933 | B2 | 10/2002 | Hsu |
| 6,803,798 | B1 | 10/2004 | Wei et al. |
| 6,807,426 | B2 | 10/2004 | Pankaj |
| 7,078,964 | B2 | 7/2006 | Risbo et al. |
| 7,205,917 | B2 | 4/2007 | Magrath |
| 7,576,605 | B2 | 8/2009 | Lee et al. |
| 7,969,242 | B2 | 6/2011 | Garudadri et al. |
| 2002/0075068 | A1 | 6/2002 | Hsu |

(Continued)

FOREIGN PATENT DOCUMENTS

| | | | |
|---|---|---|---|
| KR | 20060129544 | A | 12/2006 |
| TW | 502494 | B | 9/2002 |
| WO | WO2007124422 | | 11/2007 |

OTHER PUBLICATIONS

International Search Authority—PCT/US2009/051229—International Search Authority, European Patent Office, Oct. 16, 2009.

(Continued)

*Primary Examiner* — Henry Choe
(74) *Attorney, Agent, or Firm* — Paul S. Holdway

(57) ABSTRACT

An apparatus and method for communications are disclosed. The apparatus may include an a quantizer having three levels, and a switching power amplifier configured to drive a load having first and second terminals, wherein the switching power amplifier is further configured to switch the first and second terminals between first and second power rails only if the output from the quantizer is at one of the three levels.

32 Claims, 4 Drawing Sheets

Switching Power Amplifier 108

Switch Controller 302

302a To S1
302b To S2
302c To S3
302d To S4

$V_{DD}$

H-Bridge 304

S1 S2

Audio Speaker 110

S3 S4

$V_{SS}$

U.S. PATENT DOCUMENTS

| | | | | |
|---|---|---|---|---|
| 2002/0186155 | A1* | 12/2002 | Olson et al. | 341/143 |
| 2003/0079131 | A1 | 4/2003 | Reefman | |
| 2004/0179480 | A1 | 9/2004 | Attar et al. | |
| 2005/0043052 | A1 | 2/2005 | Whinnett et al. | |
| 2005/0111397 | A1 | 5/2005 | Attar et al. | |
| 2007/0132617 | A1 | 6/2007 | Le | |
| 2008/0111619 | A1* | 5/2008 | Matamura | 330/10 |

OTHER PUBLICATIONS

Written Opinion—PCT/US2009/051229, International Search Authority, European Patent Office, Oct. 16, 2009.

European Search Report—EP12004593—Search Authority—Munich—Aug. 28, 2012.

Taiwan Search Report—TW098125140—TIPO—Aug. 27, 2012.

* cited by examiner

SWITCHING POWER AMPLIFIER FOR QUANTIZED SIGNALS

CLAIM OF PRIORITY UNDER 35 U.S.C. §119

The present Application for Patent is a Continuation of patent application Ser. No. 12/324,020 entitled "SWITCHING POWER AMPLIFIER FOR QUANTIZED SIGNALS" filed Nov. 26, 2008, allowed, which claims priority to Provisional Application No. 61/083,470 entitled "SWITCHING POWER AMPLIFIER FOR SIGMA DELTA MODULATED SIGNALS" filed Jul. 24, 2008, and assigned to the assignee hereof and hereby expressly incorporated by reference herein.

BACKGROUND

1. Field

The present disclosure relates generally to communication systems, and more particularly, to concepts and techniques relating to switching power amplifiers for quantized signals.

2. Introduction

In portable audio devices, there is a need to conserve power in order to increase battery life. For this reason, sigma delta modulators have been used to drive switching power amplifiers, such as Class-D amplifiers and the like. Various techniques have been used to modify the output from the sigma delta modulator to drive these power amplifiers. These techniques are employed in an open loop fashion and do not take into consideration the effect of the noise shaping properties of the sigma delta modulator. This has a potential impact on the audio quality.

SUMMARY

In one aspect of the disclosure, an apparatus for communications includes a quantizer having three levels, and a switching power amplifier configured to drive a load having first and second terminals, wherein the switching power amplifier is further configured to switch the first and second terminals between first and second power rails only if the output from the quantizer is at one of the three levels.

In another aspect of the disclosure, an apparatus for communications includes means for quantizing a signal, wherein the means for quantizing the signal comprises three levels, and means for driving a load having first and second terminals, wherein the means for driving the load is configured to switch the first and second terminals between first and second power rails only if the output from the quantizer is at one of the three levels.

In yet another aspect of the disclosure, a method of communications includes quantizing a signal using a quantizer having three levels, and driving a load having first and second terminals, wherein the driving of the load includes switching the first and second terminals between first and second power rails only if the output from the quantizer is at one of the three levels.

In a further aspect of the disclosure, a headset includes a transducer having first and second terminals, a quantizer having three levels, and a switching power amplifier configured to drive the transducer by switching the first and second terminals between first and second power rails only if the output from the quantizer is at one of the three levels.

In yet a further aspect of the disclosure, a watch includes a user interface having first and second terminals, a quantizer having three levels, and a switching power amplifier configured to drive the user interface by switching the first and second terminals between first and second power rails only if the output from the quantizer is at one of the three levels.

In yet another aspect of the disclosure, a sensing device includes a sensor having first and second terminals, a quantizer having three levels, and a switching power amplifier configured to drive the sensor by switching the first and second terminals between first and second power rails only if the output from the quantizer is at one of the three levels.

In a further aspect of the disclosure, a computer program product includes a computer-readable medium comprising instructions executable to implement a quantizer having three levels, and provide switch controls in response to the quantizer that results in first and second terminals of a load being switched between first and second power rails only if the output from the quantizer is at one of the three levels.

It is understood that other aspects of the invention will become readily apparent to those skilled in the art from the following detailed description, wherein it is shown and described only various aspects of the invention by way of illustration. As will be realized, the invention is capable of other and different aspects and its several details are capable of modification in various other respects, all without departing from the scope of the invention. Accordingly, the drawings and detailed description are to be regarded as illustrative in nature and not as restrictive.

BRIEF DESCRIPTION OF THE DRAWINGS

These and other sample aspects of the disclosure will be described in the detailed description and the appended claims that follow, and in the accompanying drawings, wherein:

Figure 1:
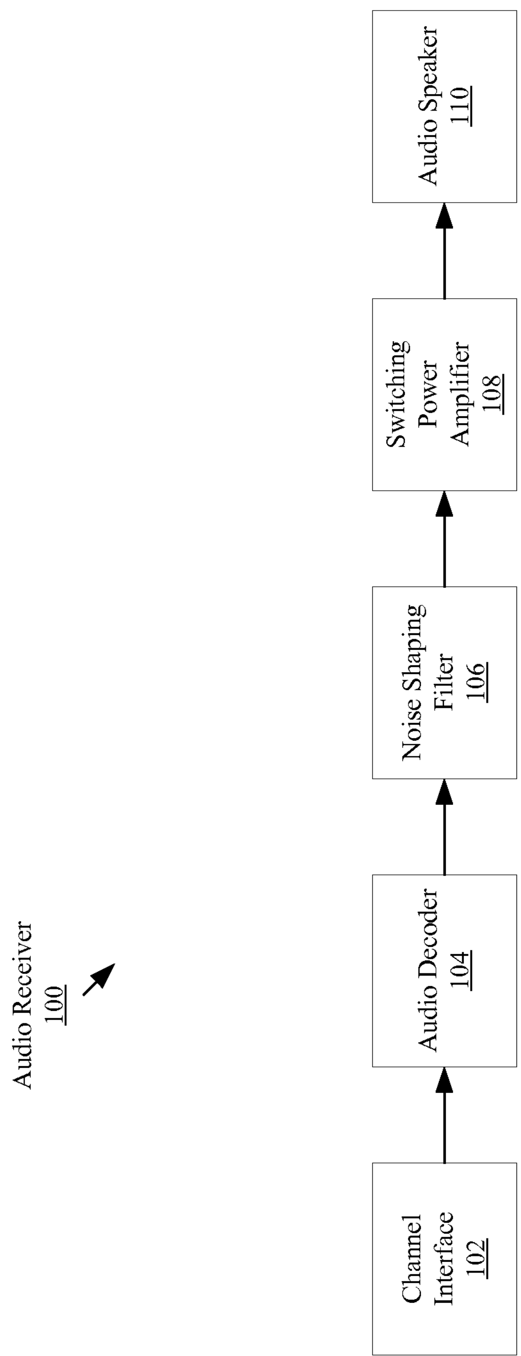
FIG. 1 is a conceptual block diagram illustrating several aspects of an audio receiver.

In accordance with common practice the various features illustrated in the drawings may be simplified for clarity. Thus, the drawings may not depict all of the components of a given apparatus (e.g., receiver) or method. In addition, like reference numerals may be used to denote like features throughout the specification and figures.

DETAILED DESCRIPTION

Various aspects of the invention are described below. It should be apparent that the teachings herein may be embodied in a wide variety of forms and that any specific structure, function, or both being disclosed herein are merely representative. Based on the teachings herein one skilled in the art should appreciate that any aspect of the invention disclosed herein may be implemented independently of any other aspects and that multiple aspects of the invention may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. An aspect may comprise one or more elements of a claim.

Various aspects of a receiver will now be presented. The various aspects of a receiver disclosed herein may be integrated into a variety of devices including, by way of example, a stand-alone receiver or communications node. The communications node may be a fixed or mobile node, such as a phone (e.g., cellular phone), a personal digital assistant (PDA), an entertainment device (e.g., a music or video device), a headset (e.g., headphones, an earpiece, etc.), a microphone, a medical sensing device (e.g., a biometric sensor, a heart rate monitor, a pedometer, an EKG device, a smart bandage, etc.), a user I/O device (e.g., a watch, a remote control, a light switch, a keyboard, a mouse, etc.), a medical monitor that may receive data from the medical sensing device, an environment sensing device (e.g., a tire pressure monitor), a computer, a point-of-sale device, an entertainment device, a hearing aid, a set-top box, or any other suitable device. The node may include various components in addition to the receiver. By way of example, a headset may include a transducer configured to provide an audio output to a user, a watch may include a user interface configured to provide an indication to a user, and a sensing device may include a sensor configured to provide an audio output to a user.

In many of the applications described above, the receiver may be part of a node that transmits as well as receives. Such a node would therefore require a transmitter, which may be a separate component or integrated with the receiver into a single component known as a "transceiver." As those skilled in the art will readily appreciate, the various concepts described throughout this disclosure are applicable to any suitable receiver function, regardless of whether the receiver is a stand-alone node, integrated into a transceiver, or part of a node in a wireless communications system.

FIG. 1 illustrates several aspects of a receiver 100. The receiver 100 is shown with a channel interface 102 that implements the physical layer by demodulating wired or wireless transmissions and performing various other functions, such as RF front-end processing, analog/digital conversion, timing and frequency estimation, channel estimation, turbo decoding, etc. The channel interface 102 may be further configured to support at least a portion of the protocol stack for a receiver operating in a wide area network (e.g., the Internet or a cellular network), a local or personal area network (e.g., networks for home, office buildings, coffee shops, transportation hubs, hotels, etc.), or other suitable network. By way of example, the channel interface 102 may be used to implement the Medium Access Control (MAC) layer by managing audio content across the physical layer in a way that enables the receiver to communicate with multiple devices in the network.

As those skilled in the art will readily appreciate, the channel interface 102 may be configured to support any suitable radio technology now known or developed in the future. By way of example, the various aspects of the receiver 100 presented throughout this disclosure may be well suited for applications supporting ultra-wideband (UWB). UWB is a common technology for high speed short range communications (e.g., local and personal area networks) as well as low speed long range communications. UWB is defined as any radio technology having a spectrum that occupies a bandwidth greater than 20 percent of the center frequency, or a bandwidth of at least 500 MHz. Other examples of radio technology that may be supported by the channel interface 102 include Bluetooth, WiMax, and Wi-Fi, just to name a few. Alternatively, or in addition to, the channel interface 102 may be configured to support wired technologies, such as cable modem, digital subscriber line (DSL), Ethernet, and so on. Those skilled in the art will be readily able to implement a channel interface 102 capable of supporting the interface to the wireless or wired channel to meet the requirements of any particular application.

An audio decoder 104 may be used to reconstruct an audio signal from an encoded transmission recovered by the channel interface 102. In one example of an audio receiver 100, the audio decoder 104 may be configured to reconstruct an audio signal encoded with a backward adaptive gain ranged algorithm, however, the audio decoder 104 may be configured to handle other encoding schemes. Those skilled in the art will be readily able to implement the appropriate audio decoder 104 for any particular application. The audio decoder 104 may be a stand-alone component as shown in FIG. 1, or integrated into an audio codec in the case where the receiver 100 is part of a node that transmits as well as receives.

The audio signal reconstructed by the audio decoder 104 may be provided to a noise shaping filter 106. The noise shaping filter 106 reduces quantization noise in the audio band by distributing it over a larger spectrum. The distribution of the quantization noise may be shaped with reduced noise at low frequencies and increased noise at higher frequencies, where it can be filtered. The noise shaping filter 106 may be implemented with a sigma delta modulator or by some other suitable means.

The output from the noise shaping filter 106 may be provided to a switching power amplifier 108. The switching power amplifier 108, which will be described in greater detail later, is used to drive an audio speaker 110.

Figure 2:
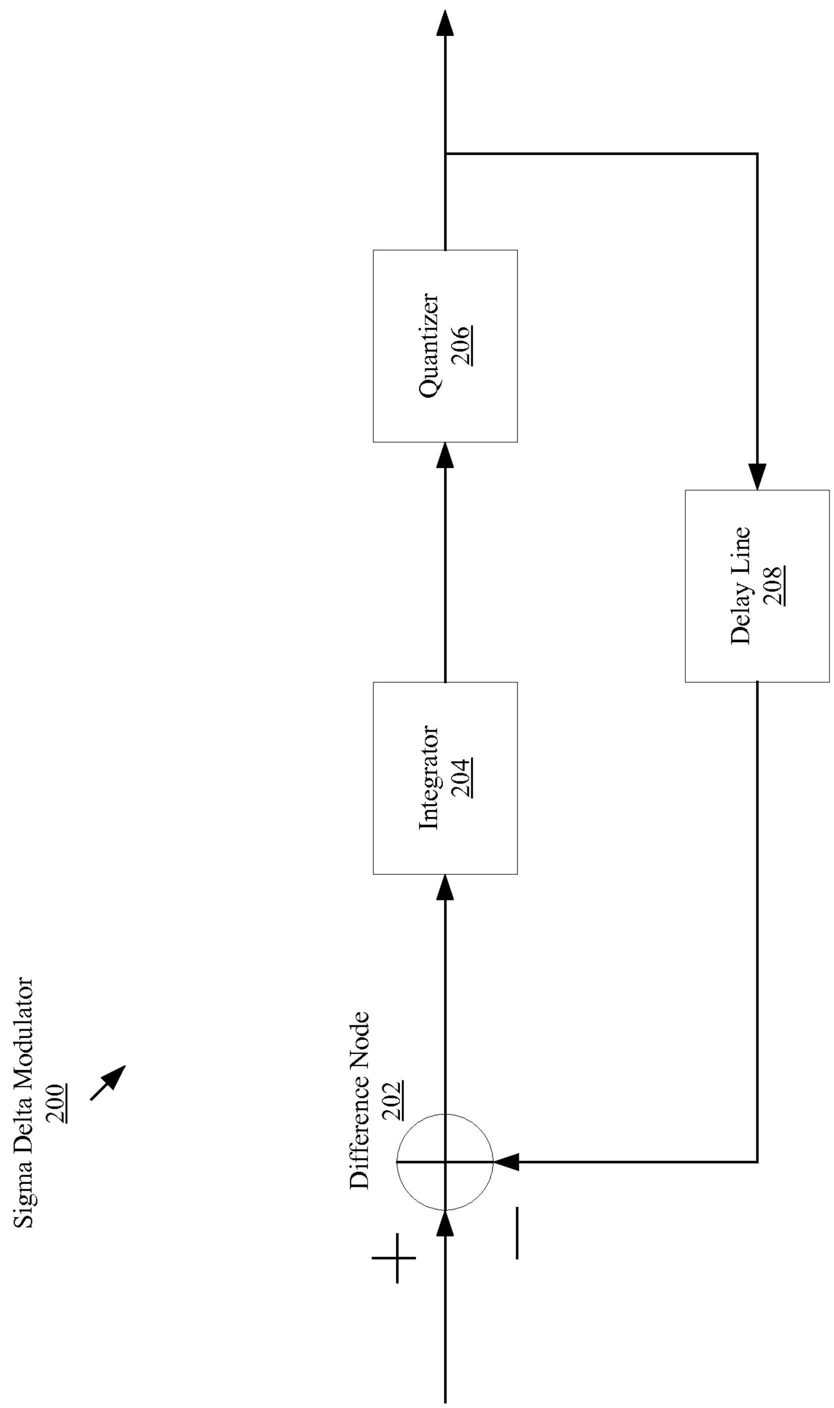
FIG. 2 is a conceptual block diagram illustrating several aspects of a sigma-delta modulator.

FIG. 2 illustrates several aspects of a sigma delta modulator for use in a receiver. In this example, the sigma delta modulator 200 includes a difference node 202, an integrator 204, a quantizer 206, and a delay line 208. The difference node 202 is used to subtract the output from the sigma delta modulator 200 (via the delay line 208) from the input signal, the result being equal to the quantization error. The error is summed up in the integrator 204 and quantized by the quantizer 206. The quantizer 206 may be configured to have three or more levels instead of a binary output. In the case of a quantizer 206 with three levels, a 2-bit output may be provided to the switching power amplifier 108 (see FIG. 1).

Figure 3:
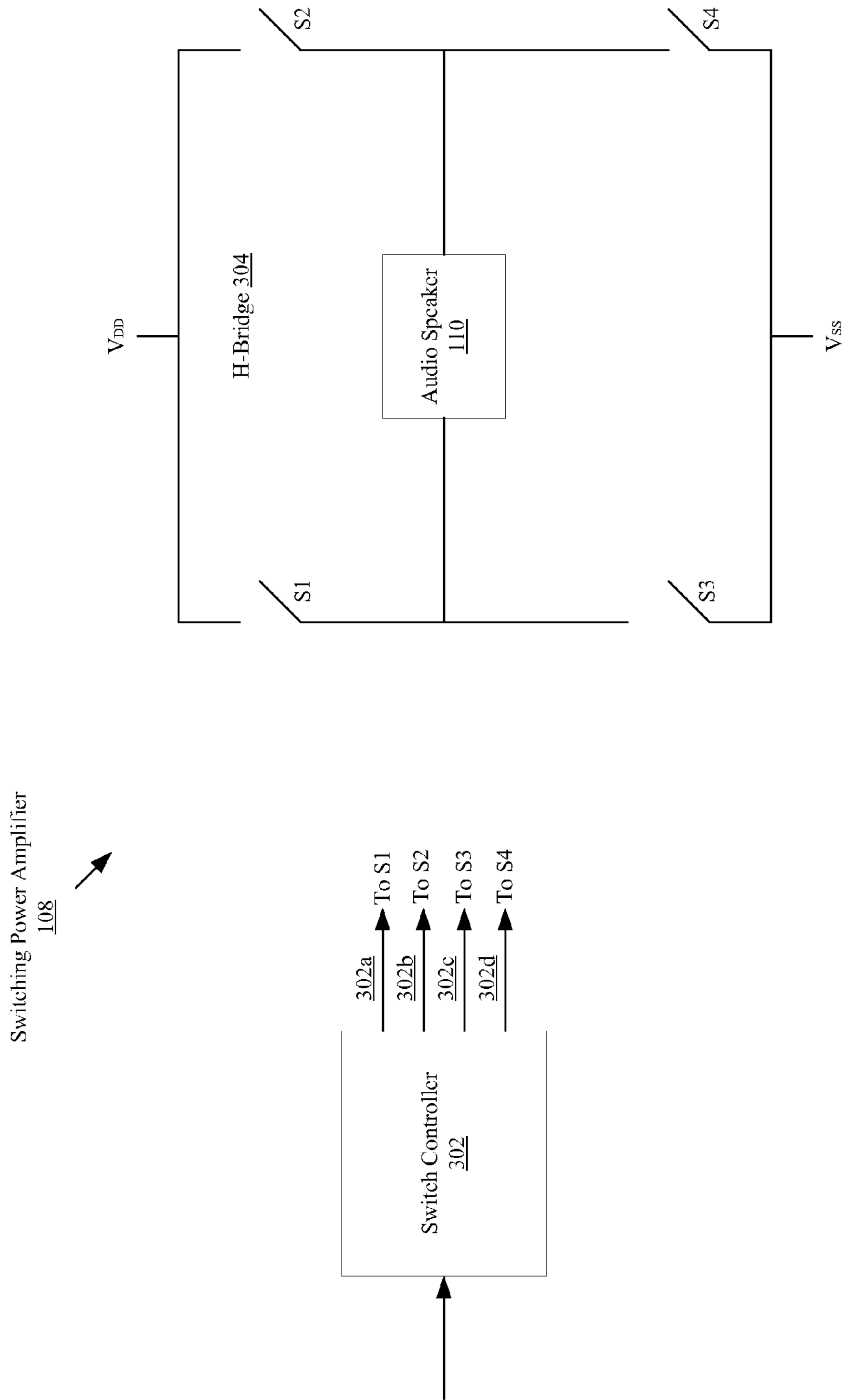
FIG. 3 is a conceptual block diagram illustrating several aspects of a switching power amplifier driving an audio speaker.

FIG. 3 illustrates several aspect of a switching power amplifier for driving an audio speaker. The switching power amplifier 108 is shown with a switch controller 302 and an H-bridge 304. In a manner to be described in greater detail below, the H-bridge 304 is configured to switch the terminals of the audio speaker 110 between the positive power rail (e.g., a voltage source $V_{DD}$) and the negative power rail (e.g., a voltage return $V_{SS}$).

In at least one configuration of a receiver, the switch controller 302 performs logic functions on the quantized output from the noise shaping filter (e.g., sigma delta modulator) to control a number of switches in the H-bridge 304. The switches may be implemented with transistors, or by some other suitable means. In the former case, the transistor switches may be Metal-Oxide-Semiconductor Field-Effect Transistors (MOSFET). In this configuration, the first and second switches S1 and S2 may be p-channel MOSFETs and the third and fourth switches S3 and S4 may be n-channel MOSFETs. The first MOSFET S1 may be connected between the positive power rail (e.g., voltage source $V_{DD}$) and a first terminal T1 of the audio speaker 110, the second MOSFET S2 may be connected between the positive power rail (e.g., voltage source $V_{DD}$) and a second terminal T2 of the audio speaker 110, the third MOSFET S3 may be connected between the negative power rail (e.g., voltage return $V_{SS}$) and the first terminal T1 of the audio speaker 110, and the fourth MOSFET S4 may be connected between the negative power rail (e.g., voltage return $V_{SS}$) and the second terminal T2 of the audio speaker 110. The switch controller 302 includes a first output 302*a* connected to the gate of the first MOSFET S1, a second output 302*b* connected to the gate of the second MOSFET S2, and third output 302*c* connected to the gate of the third MOSFET S3, and a fourth output 302*d* connected to the gate of the fourth MOSFET S4.

Table 1 summarizes the operation of the H-bridge 304 and audio speaker 110 with the switching power amplifier driven from a 3-level quantized output, as the case may be with the sigma-delta modulator illustrated in FIG. 2. When referring to Table 1, the term "forward direction" means that current is flowing through the audio speaker 110 from the first terminal T1 to the second terminal T2, and the term "reverse direction" means that current is flowing through the audio speaker 110 from the second terminal T2 to the first terminal T1.

TABLE 1

| Sigma Delta Modulator Output | | |
|---|---|---|
| 2-bit Output | Quantizer Level | Result |
| 00 | −1 | Current flows through the audio speaker in a forward direction. |
| 01 | 0 | No current flows through the audio speaker. |
| 10 | 1 | Current flows through the audio speaker in a reverse direction. |
| 11 | — | ILLEGAL |

Referring to FIG. 3 in conjunction with Table 1, when the quantized level is −1, the switch controller 302 closes the switches S1 and S4 and opens the switches S2 and S3. With this switch configuration, the first switch S1 connects the positive power rail (e.g., voltage source $V_{DD}$) to the first terminal T1 of the audio speaker 110, and the fourth switch S4 connects the second terminal T2 of the audio speaker 110 to the negative power rail (e.g., voltage return $V_{SS}$), thus resulting in current flow in the forward direction (i.e., from T1 to T2). When the quantized level is 1, the switch controller 302 opens the switches S1 and S4 and closes the switches S2 and S3. With this switch configuration, the second switch S2 connects the positive power rail (e.g., voltage source $V_{DD}$) to the second terminal T2 of the audio speaker 110, and the third switch S3 connects the first terminal T1 of the audio speaker 110 to the negative power rail (e.g., voltage return $V_{SS}$), thus resulting in current flow in the reverse direction (i.e., from T2 to T1).

In order to minimize power consumption when the quantized level is 0, the switch controller 302 may be configured to connect the audio speaker 110 across one of the power rails. By way of example, the switch controller 302 may connect the audio speaker 110 across the positive power rail (e.g., voltage source $V_{DD}$) by closing the switches S1 and S2 and opening switches S3 and S4. Alternatively, the switch controller 302 may connect the audio speaker 110 across the negative power rail (e.g., voltage return $V_{SS}$) by opening switches S1 and S2 and closing switches S3 and S4. By connecting the audio speaker 110 across one of the power rails, no current flows through the audio speaker 110.

In at least one configuration of the switching power amplifier 108, the switch controller 302 may be configured to alternately connect the audio speaker 110 across the positive power rail (e.g., voltage source $V_{DD}$) and the negative rail (e.g., voltage source $V_{SS}$) to avoid common mode drift. By way of example, when the quantized level is 0, the switch controller 302 closes the switches S1 and S2 and opens the switches S3 and S4. At some time later, while the quantized level is still 0, the switch controller 302 opens the switches S1 and S2 and closes the switches S3 and S4. This process may be repeated while the quantized level remains at 0. The duty cycle of the switches S1, S2, S3 and S4 may be 50%, or some other percentage. As another example, the switch controller 302 may be configured to close switches S1 and S2 and open switches S3 and S4 for the entire period that the quantized level is 0, and the next time the quantized level switches to 0 (i.e., following one or more intervening non-zero quantized levels), the switch controller 302 may open switches S1 and S2 and close switches S3 and S4.

When the quantized level switches, the switch controller 302 preferably operates the switches S1, S2, S3 and S4 in a break-before-make fashion to avoid short circuit current in the H-bridge 304.

The 3-level quantizer driving the switching power amplifier, as the case may be with the sigma-delta modulator illustrated in FIG. 2, may be configured for non-uniform quantization to control the density of zero and non-zero quantized levels. Uniform quantization levels may be established by setting the quantization threshold between −1 and 0 to ⅓ of the full voltage swing between the power rails and setting the threshold between 0 and 1 to ⅔ of the full voltage swing between the rails. By way of example, if the positive power rail (e.g., voltage source $V_{DD}$) is +15V and the negative power rail (e.g., voltage return $V_{SS}$) is −15V, the quantization threshold between −1 and 0 is set to −5V and the quantization level between 0 and 1 is set to +5V.

As the quantization thresholds move closer to one another, the density of zeros decreases. As a limiting case in the above example, when both quantization thresholds are at zero, the quantizer reduces to a two-level case with no zeros. On the other extreme, as the quantization threshold between −1 and 0 moves towards the negative power rail (e.g., voltage return $V_{SS}$) and the quantization threshold between 0 and 1 moves towards the positive power rail (e.g., voltage source $V_{DD}$), the density of zeros increase.

This feature can be used to dynamically control the distribution of zeros based on volume level. For low volume signals, the quantization thresholds can be moved closer to the power rails to ensure a larger distribution of zeros. This reduces the switching in the H-bridge, and therefore, results in power consumption that scales with signal levels. Alternatively, the quantization thresholds may be fixed based on trade-offs between audio quality and switching loss.

It will be understood that when a switch is described as "connecting" one of the power rails to one of the terminals of the audio speaker 110, it can directly connect the power rail to such terminal or intervening components may be present.

It will be further understood that relative terms, such as those used to describe current flowing through the audio speaker in the "forward" and "reverse" directions are used herein solely to illustrate the operation of the H-bridge as illustrated in the drawings. One skilled in the art may elect to describe current flowing through the audio speaker 110 from T1 to T2 as the "reverse direction" and vice versa.

Similarly, the terms "positive" and "negative" power rails are used herein to illustrate that one power rail is positive or negative with respect to the other power rail. It is not being used to indicate that a power rail has a positive or negative voltage. By way of example, the negative power rail (e.g., voltage return $V_{SS}$) may be at ground.

Figure 4:
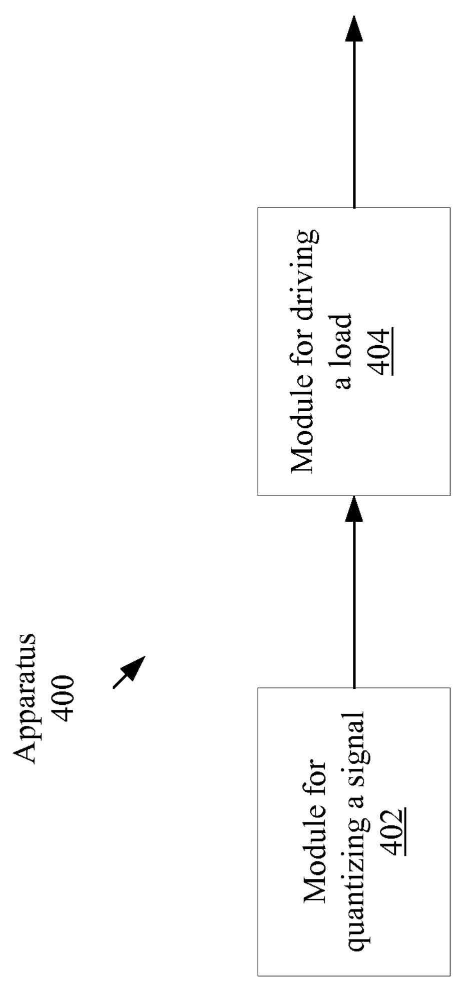
FIG. 4 is a block diagram illustrating an example of the functionality of an audio receiver.

FIG. 4 is a block diagram illustrating an example of the functionality of an apparatus. In this example, the apparatus 400 includes a module 402 for quantizing a signal. The module 402 may be implemented by the noise shaping filter 106

(see FIG. 1) described above or by some other suitable means. In one configuration of the module 402, the quantized signal has three levels. The apparatus 400 also includes a module 404 for driving a load having first and second terminals, wherein the module 404 is configured to switch the first and second terminals between first and second power rails only if the output from the quantizer is at one of the three levels. The module 404 may be implemented by the switching power amplifier (see FIG. 1) described above or by some other suitable means.

The components described herein may be implemented in a variety of ways. For example, an apparatus may be represented as a series of interrelated functional blocks that may represent functions implemented by, for example, one or more integrated circuits (e.g., an ASIC) or may be implemented in some other manner as taught herein. As discussed herein, an integrated circuit may include a processor, software, other components, or some combination thereof. Such an apparatus may include one or more modules that may perform one or more of the functions described above with regard to various figures.

As noted above, some aspects of the receiver may be implemented via appropriate processor components. These processor components may in some configurations be implemented, at least in part, using structure as taught herein. In some configurations, a processor may be adapted to implement a portion or all of the functionality of one or more of these components.

As noted above, an apparatus may comprise one or more integrated circuits. For example, a single integrated circuit may implement the functionality of one or more of the illustrated components, while in other configurations of a receiver, more than one integrated circuit may implement the functionality of one or more of the illustrated components.

In addition, the components and functions described herein may be implemented using any suitable means. Such means also may be implemented, at least in part, using corresponding structure as taught herein. For example, the components described above may be implemented in an "ASIC" and also may correspond to similarly designated "means for" functionality. Thus, one or more of such means may be implemented using one or more of processor components, integrated circuits, or other suitable structure as taught herein.

Also, it should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of: A, B, or C" used in the description or the claims means "A or B or C or any combination thereof"

Those of skill would further appreciate that any of the various illustrative logical blocks, modules, processors, means, circuits, and algorithm steps described in connection with the various aspects of a receiver disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes (e.g., executable by at least one computer) relating to one or more of the aspects of the disclosure. In some aspects a computer program product may comprise packaging materials.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An apparatus, comprising:

a quantizer adapted to quantize a signal into one of first, second and third levels in a non-uniform manner, wherein the signal is quantized into the first level in response to a value of the signal being in a first range, wherein the signal is quantized into the second level in response the value of the signal being in a second range, wherein the signal is quantized into the third level in response the value of the signal being in a third range, and wherein the size of the third range is different than at least one of the sizes of the first and second ranges; and a switching power amplifier, comprising:

a switching network; and a controller adapted to:

set the switching network in a first configuration to produce a forward current through a load in response to the quantized signal being in the first level;

set the switching network in a second configuration to produce a reverse current through the load in response to the quantized signal being in the second level; and alternately set the switching network between third and fourth configurations, both of which produce no current through the load in response to the quantized signal being in the third level.

2. The apparatus of claim 1, wherein the quantizer is adapted to quantize the signal in the non-uniform manner to increase the quantization of the signal into the third level.

3. The apparatus of claim 1, wherein the non-uniformity of the quantization of the signal is based on a volume level associated with the signal.

4. The apparatus of claim 3, wherein the non-uniformity of the quantization of the signal is configured to increase the quantization of the signal into the third level if the volume level is decreased.

5. The apparatus of claim 1, wherein the controller is adapted to alternately set the switching network between the third and fourth configurations to avoid common mode drift.

6. The apparatus of claim 1, wherein the controller is adapted to alternately set the switching network between the third and fourth configurations while the signal is quantized into the third level.

7. The apparatus of claim 1, wherein the controller is adapted to alternately set the switching network between the third and fourth configurations following one or more intervening quantization of the signal into the first or second level.

8. The apparatus of claim 1, wherein the switching power amplifier further comprises a power source adapted to produce the forward or reverse current through the load.

9. The apparatus of claim 8, wherein the power source comprises positive and negative power rails both coupled to the load by way of the switching network.

10. The apparatus of claim 9, wherein the switching network comprises:

a first switching element coupled between the positive power rail of the power source and a first terminal of the load;

a second switching element coupled between the positive power rail of the power source and a second terminal of the load;

a third switching element coupled between the negative power rail of the power source and the first terminal of the load; and a fourth switching element coupled between the negative power rail of the power source and the second terminal of the load.

11. The apparatus of claim 10, wherein the first configuration of the switching network comprises:

the first switching element configured to couple the positive power rail to the first terminal of the load;

the second switching element configured to decouple the positive power rail from the second terminal of the load;

the third switching element configured to decouple the negative power rail from the first terminal of the load; and the fourth switching element configured to couple the negative power rail to the second terminal of the load.

12. The apparatus of claim 10, wherein the second configuration of the switching network comprises:

the first switching element configured to decouple the positive power rail from the first terminal of the load;

the second switching element configured to couple the positive power rail to the second terminal of the load;

the third switching element configured to couple the negative power rail to the first terminal of the load; and the fourth switching element configured to decouple the negative power rail from the second terminal of the load.

13. The apparatus of claim 10, wherein the third configuration of the switching network comprises:

the first switching element configured to couple the positive power rail to the first terminal of the load;

the second switching element configured to couple the positive power rail to the second terminal of the load;

the third switching element configured to decouple the negative power rail from the first terminal of the load; and the fourth switching element configured to decouple the negative power rail from the second terminal of the load.

14. The apparatus of claim 10, wherein the fourth configuration of the switching network comprises:

the first switching element configured to decouple the positive power rail from the first terminal of the load;

the second switching element configured to decouple the positive power rail from the second terminal of the load;

the third switching element configured to couple the negative power rail to the first terminal of the load; and the fourth switching element configured to couple the negative power rail to the second terminal of the load.

15. A method of processing a signal, comprising:

quantizing the signal into one of first, second and third levels in a non-uniform manner, wherein the signal is quantized into the first level in response to a value of the signal being in a first range, wherein the signal is quantized into the second level in response the value of the signal being in a second range, wherein the signal is quantized into the third level in response the value of the signal being in a third range, and wherein the size of the third range is different than at least one of the sizes of the first and second ranges;

setting a switching network in a first configuration to produce a forward current through a load in response to the quantized signal being in the first level;

setting the switching network in a second configuration to produce a reverse current through the load in response to the quantized signal being in the second level; and alternately setting the switching network between third and fourth configurations, both of which produce no current through the load in response to the quantized signal being in the third level.

16. The method of claim 15, wherein quantizing the signal comprises non-uniformly quantizing the signal into one of first, second and third levels to increase the quantization of the signal into the third level.

17. The method of claim 15, wherein the non-uniformity of the quantization of the signal is based on a volume level associated with the signal.

18. The method of claim 17, wherein the non-uniformity of the quantization of the signal is configured to increase the quantization of the signal into the third level if the volume level is decreased.

19. The method of claim 15, wherein alternately setting the switching network comprises alternately setting the switching network between the third and fourth configurations to avoid common mode drift.

20. The method of claim 15, wherein alternately setting the switching network comprises alternating the switching network between the third and fourth configurations while the signal is quantized into the third level.

21. The method of claim 15, wherein alternately setting the switching network comprises alternating the switching network between the third and fourth configurations following one or more intervening quantization of the signal into the first or second level.

22. The method of claim 15, further comprising supplying power to produce the forward or reverse current through the load.

23. The method of claim 22, wherein supplying power comprises providing a positive power rail and a negative power rail to generate the forward or reverse current through the load.

24. The method of claim 23, wherein the switching network comprises:

a first switching element coupled between the positive power rail of the power source and a first terminal of the load;

a second switching element coupled between the positive power rail of the power source and a second terminal of the load;

a third switching element coupled between the negative power rail of the power source and the first terminal of the load; and a fourth switching element coupled between the negative power rail of the power source and the second terminal of the load.

25. The method of claim 24, wherein setting the switching network in the first configuration comprises:

configuring the first switching element to couple the positive power rail to the first terminal of the load;

configuring the second switching element to decouple the positive power rail from the second terminal of the load;

configuring the third switching element to decouple the negative power rail from the first terminal of the load; and configuring the fourth switching element to couple the negative power rail to the second terminal of the load.

26. The method of claim 24, wherein setting the switching network in the second configuration comprises:

configuring the first switching element to decouple the positive power rail from the first terminal of the load;

configuring the second switching element to couple the positive power rail to the second terminal of the load;

configuring the third switching element to couple the negative power rail to the first terminal of the load; and configuring the fourth switching element to decouple the negative power rail from the second terminal of the load.

27. The method of claim 24, wherein setting the switching network in the third configuration comprises:

configuring the first switching element to couple the positive power rail to the first terminal of the load;

configuring the second switching element to couple the positive power rail to the second terminal of the load;

configuring the third switching element to decouple the negative power rail from the first terminal of the load; and configuring the fourth switching element to decouple the negative power rail from the second terminal of the load.

28. The method of claim 24, wherein setting the switching network in the fourth configuration comprises:

configuring the first switching element to decouple the positive power rail from the first terminal of the load;

configuring the second switching element to decouple the positive power rail from the second terminal of the load;

configuring the third switching element to couple the negative power rail to the first terminal of the load; and configuring the fourth switching element to couple the negative power rail to the second terminal of the load.

29. An apparatus, comprising:

means for quantizing the signal into one of first, second and third levels in a non-uniform manner, wherein the signal is quantized into the first level in response to a value of the signal being in a first range, wherein the signal is quantized into the second level in response the value of the signal being in a second range, wherein the signal is quantized into the third level in response the value of the signal being in a third range, and wherein the size of the third range is different than at least one of the sizes of the first and second ranges; and means for setting a switching means in a first configuration to produce a forward current through a load in response to the quantized signal being in the first level;

means for setting the switching means in a second configuration to produce a reverse current through the load in response to the quantized signal being in the second level; and means for alternately setting the switching means between third and fourth configurations, both of which produce no current through the load in response to the quantized signal being in the third level.

30. A headset, comprising:

a transducer;

a quantizer adapted to quantize an audio signal into one of first, second and third levels in a non-uniform manner, wherein the signal is quantized into the first level in response to a value of the signal being in a first range, wherein the signal is quantized into the second level in response the value of the signal being in a second range, wherein the signal is quantized into the third level in response the value of the signal being in a third range, and wherein the size of the third range is different than at least one of the sizes of the first and second ranges; and a switching power amplifier, comprising:

a switching network; and a controller adapted to:

set the switching network in a first configuration to produce a forward current through the transducer in response to the quantized audio signal being in the first level;

set the switching network in a second configuration to produce a reverse current through the transducer in response to the quantized audio signal being in the second level; and alternately set the switching network between third and fourth configurations, both of which produce no current through the transducer in response to the quantized audio signal being in the third level.

31. A watch, comprising:

a quantizer adapted to quantize a signal into one of first, second and third levels in a non-uniform manner, wherein the signal is quantized into the first level in response to a value of the signal being in a first range, wherein the signal is quantized into the second level in response the value of the signal being in a second range, wherein the signal is quantized into the third level in response the value of the signal being in a third range, and wherein the size of the third range is different than at least one of the sizes of the first and second ranges;

a switching power amplifier, comprising:

a switching network; and a controller adapted to:

set the switching network in a first configuration to produce a forward current through a load in response to the quantized signal being in the first level;

set the switching network in a second configuration to produce a reverse current through the load in response to the quantized signal being in the second level; and alternately set the switching network between third and fourth configurations, both of which produce no current through the load in response to the quantized signal being in the third level; and a user interface adapted to generate an output based on the forward or reverse current through the load.

32. A sensing device, comprising:

a sensor adapted to generate a signal;

a quantizer adapted to quantize the signal into one of first, second and third levels in a non-uniform manner, wherein the signal is quantized into the first level in response to a value of the signal being in a first range, wherein the signal is quantized into the second level in response the value of the signal being in a second range, wherein the signal is quantized into the third level in response the value of the signal being in a third range, and wherein the size of the third range is different than at least one of the sizes of the first and second ranges; and a switching power amplifier, comprising:

a switching network; and a controller adapted to:

set the switching network in a first configuration to produce a forward current through a load in response to the quantized signal being in the first level;

set the switching network in a second configuration to produce a reverse current through the load in response to the quantized signal being in the second level; and alternately set the switching network between third and fourth configurations, both of which produce no current through the load in response to the quantized signal being in the third level.

* * * * *